(12) United States Patent
Yuan et al.

(10) Patent No.: US 11,817,307 B2
(45) Date of Patent: Nov. 14, 2023

(54) DISPLAY SUBSTRATE AND METHOD FOR MANUFACTURING THE SAME (71) Applicant: BOE TECHNOLOGY GROUP CO., LTD., Beijing (CN)

(72) Inventors: Guangcai Yuan, Beijing (CN); Zhijun Lv, Beijing (CN); Haixu Li, Beijing (CN); Xiaoxin Song, Beijing (CN); Feng Zhang, Beijing (CN); Wenqu Liu, Beijing (CN); Liwen Dong, Beijing (CN); Zhao Cui, Beijing (CN); Libo Wang, Beijing (CN); Detian Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 129 days.

(21) Appl. No.: 16/766,735

(22) PCT Filed: Jul. 24, 2019

(86) PCT No.: PCT/CN2019/097438
§ 371 (c)(1),
(2) Date: May 25, 2020

(87) PCT Pub. No.: WO2021/012207
PCT Pub. Date: Jan. 28, 2021

(65) Prior Publication Data
US 2021/0408330 A1    Dec. 30, 2021

(51) Int. Cl.
*H01L 33/00* (2010.01)
*H01L 33/38* (2010.01)
(Continued)

(52) U.S. Cl.
CPC .............. *H01L 33/38* (2013.01); *H01L 24/14* (2013.01); *H01L 24/17* (2013.01); *H01L 24/81* (2013.01);
(Continued)

(58) Field of Classification Search
CPC ......... H01L 33/62; H01L 24/14; H01L 27/12; H01L 24/13; H01L 33/38; H01L 24/17;
(Continued)

(56) References Cited

U.S. PATENT DOCUMENTS 6,881,599 B2 * 4/2005 Oohata ............... H01S 5/04256
257/E33.059
9,627,347 B2 * 4/2017 Aoyagi .................. B23K 20/10
(Continued)

FOREIGN PATENT DOCUMENTS

CN    101026204 A    8/2007
CN    101414596 A    4/2009
(Continued)

OTHER PUBLICATIONS

Examination report issued for Indian Patent Application No. 202027053221, dated Mar. 9, 2022, 5 pages.
(Continued)

*Primary Examiner* — Savitri Mulpuri
(74) *Attorney, Agent, or Firm* — Dave Law Group LLC; Raj S. Dave (57) ABSTRACT

The present disclosure relates to a display substrate and a method for manufacturing the same. The display substrate includes: a substrate; a first electrode located on the substrate; and a conductive convex located on the first electrode. A dimension of a cross section of the conductive convex along a plane parallel to the substrate is negatively correlated to a distance from the cross section to a surface of the first electrode.

14 Claims, 9 Drawing Sheets

(51) Int. Cl.
  *H01L 33/58* (2010.01)
  *H01L 33/62* (2010.01)
  *H01L 23/00* (2006.01)

(52) U.S. Cl.
  CPC ............ *H01L 33/005* (2013.01); *H01L 33/58* (2013.01); *H01L 33/62* (2013.01); *H01L 2933/0016* (2013.01)

(58) Field of Classification Search
  CPC ......... H01L 24/08; H01L 24/83; H01L 27/00; H01L 24/16; H01L 24/92; H01L 33/005; H01L 25/167; H01L 33/58; H01L 24/73; H01L 27/153; H10K 50/80
  See application file for complete search history.

(56) References Cited

U.S. PATENT DOCUMENTS

| | | | |
|---|---|---|---|
| 2008/0017873 | A1 | 1/2008 | Tomoda et al. |
| 2009/0206351 | A1 | 8/2009 | Cheong |
| 2010/0219444 | A1 | 9/2010 | Wada et al. |
| 2018/0013081 | A1 | 1/2018 | Chou et al. |
| 2018/0138071 | A1 | 5/2018 | Bower et al. |
| 2018/0286734 | A1 | 10/2018 | Meitl et al. |
| 2018/0342492 | A1 | 11/2018 | Lu |
| 2020/0243739 | A1 | 7/2020 | Fukaya et al. |

FOREIGN PATENT DOCUMENTS

| | | | |
|---|---|---|---|
| CN | 101840892 | A | 9/2010 |
| CN | 107742636 | A | 2/2018 |
| JP | 2003262882 | A | 9/2003 |
| JP | 2007180166 | A | 7/2007 |
| JP | 2008-27933 | A | 2/2008 |
| JP | 2009099765 | A | 5/2009 |
| JP | 2010219272 | A | 9/2010 |
| JP | 2010-226086 | A | 10/2010 |
| KR | 20140147942 | A | 12/2014 |
| WO | 2001068311 | A1 | 9/2001 |
| WO | 2018152907 | A1 | 8/2018 |
| WO | 2018214199 | A1 | 11/2018 |
| WO | 2019082758 | A1 | 5/2019 |

OTHER PUBLICATIONS

International Search Report issued in International Application No. PCT/CN2019/097438, dated Apr. 10, 2020, 7 pages.
Written Opnion issued in International Application No. PCT/CN2019/097438, dated Apr. 10, 2020, 4 pages.
European Search report issued for EP Application No. 19931502.9, dated Jun. 8, 2022, 9 pages.
Office Action issued for Japanese patent Application No. 2021-500811, dated Jul. 27, 2023, 18 pages.

* cited by examiner

DISPLAY SUBSTRATE AND METHOD FOR MANUFACTURING THE SAME

CROSS-REFERENCE TO RELATED APPLICATIONS

This patent application is the National Stage Entry of PCT/CN2019/097348, filed on Jul. 24, 2019, the entire disclosure of which is incorporated herein by reference as part of the present application.

FIELD

Embodiments of the present disclosure relate to a field of displaying technology, in particular, to a display substrate and a method for manufacturing the same.

BACKGROUND

Micro LED is regarded as the next-generation display technology which is most likely to replace OLED.

The advantages of micro LED include low power consumption, high brightness, ultra-high resolution and color saturation, fast response, ultra power saving, long lifetime, high efficiency, adaptability to various dimensions, seamless stitching, etc. The power consumption of micro LED is 10% of LCD and 50% of OLED, so it is suitable for wearable devices.

BRIEF DESCRIPTION

Embodiments of the present disclosure provide a display substrate and a method for manufacturing the same.

In one aspect of the present disclosure, a display substrate is provided. The display substrate includes: a substrate; a first electrode located on the substrate; and a conductive convex located on the first electrode. A dimension of a cross section of the conductive convex along a plane parallel to the substrate is negatively correlated to a distance from the cross section to a surface of the first electrode.

In an exemplary embodiment of the present disclosure, a ratio of a minimum dimension of a surface of a side of the conductive convex facing the substrate along a direction parallel to the substrate to a distance from the conductive convex to the first electrode ranges from 1:1 to 1:3.

In an exemplary embodiment of the present disclosure, a shape of the conductive convex is at least one selected from a group consisting of a cone, a truncated cone, and a prism.

In an exemplary embodiment of the present disclosure, the conductive convex includes a first portion and a second portion covering the first portion. An orthographic projection of the first portion on the substrate is located within an orthographic projection of the first electrode on the substrate. The second portion is in contact with the first electrode. A surface of the second portion away from the substrate is conformal to a surface of the first portion away from the substrate. The first portion is composed of a dielectric material, and the second portion is composed of a conductive material.

In an exemplary embodiment of the present disclosure, the dielectric material includes an organic material. The conductive convex further includes an inorganic material layer covering the first portion and located between the first portion and the second portion.

In an exemplary embodiment of the present disclosure, the second portion further covers a surface of the first electrode adjacent to the first portion.

In an exemplary embodiment of the present disclosure, the conductive convex is composed of a conductive material.

In an exemplary embodiment of the present disclosure, the first electrode is formed integrally with the conductive convex. A ratio of a thickness of the first electrode to a distance from a top of the conductive convex to a bottom of the first electrode ranges from 1:4 to 1:2.

In an exemplary embodiment of the present disclosure, a plurality of conductive convexes arranged in an array are disposed on each of the first electrodes.

In an exemplary embodiment of the present disclosure, the conductive convex includes a triangular prism. The triangular prism includes a first surface parallel to the surface of the substrate, the first surface includes a first side and a second side intersecting the first side. A dimension of the first side is 2-10 µm. A dimension of the second side is 1-5 µm. A height of the triangular prism along a direction perpendicular to the substrate is 1-5 µm. A distance between two adjacent conductive convexes in a direction of the first side is 2-10 µm. A distance between two adjacent conductive convexes in a direction of the second side is 2-5 µm.

In an exemplary embodiment of the present disclosure, the display substrate further includes: an electronic device located on the conductive convex; and an adhesive located between the conductive convexes. A pin of the electronic device is in contact with the conductive convex. The pin is joined to the first electrode by the adhesive.

In an exemplary embodiment of the present disclosure, the display substrate further includes: a thin film transistor located on the substrate; and a first dielectric layer located on the thin film transistor. The first electrode is located on the first dielectric layer and is electrically connected to the thin film transistor.

In an exemplary embodiment of the present disclosure, the first dielectric layer includes a first sub-dielectric layer and a second sub-dielectric layer sequentially stacked. The display substrate further includes a second electrode and a third electrode located between the first sub-dielectric layer and the second sub-dielectric layer. The second electrode is connected to a source/drain region of the thin film transistor via a first hole in the first sub-dielectric layer. The first electrode includes a first sub-electrode and a second sub-electrode. The first sub-electrode is connected to the second electrode via a second hole in the second sub-dielectric layer. The second sub-electrode is connected to the third electrode via a third hole in the second sub-dielectric layer.

In one aspect of the present disclosure, a method for manufacturing a display substrate is provided. The method includes: provide a substrate; forming a first electrode on the substrate; and forming a conductive convex on the first electrode. A dimension of a cross section of the conductive convex along a plane parallel to the substrate is negatively correlated to a distance from the cross section to a surface of the first electrode.

In an exemplary embodiment of the present disclosure, forming the conductive convex includes: forming a dielectric material layer on the first electrode; patterning the dielectric material layer to form a first portion of the conductive convex; forming a first conductive material layer on the substrate, the first electrode, and the first portion; and patterning the first conductive material layer to form a second portion of the conductive convex. An orthographic projection of the first portion on the first electrode is located within an orthographic projection of the second portion on the first electrode. The second portion covers the first electrode and is in contact with the first electrode. A surface of the second portion away from the substrate is conformal to a surface of the first portion away from the substrate.

In an exemplary embodiment of the present disclosure, before forming the first conductive material layer on the first portion, the method further includes roughening a surface of the first portion.

In an exemplary embodiment of the present disclosure, the second portion is formed to also cover a surface of the first electrode adjacent to the first portion.

In an exemplary embodiment of the present disclosure, the dielectric material layer includes a photosensitive material. Patterning the dielectric material layer includes exposing the dielectric material layer using a first mask and developing the dielectric material layer. A radiation dose of a light used for the exposure, a dimension of a light shielding portion of the first mask along a direction perpendicular to a direction in which the light shielding portion extends, and a distance between the first mask and the dielectric material layer are configured such that a diffracted light is generated at an edge of the light shielding portion during the exposure, wherein at least a portion of the diffracted light can reach a surface of the dielectric material layer located below a central portion of the light shielding portion.

In an exemplary embodiment of the present disclosure, forming the conductive convex further includes: forming an inorganic material layer on the first portion after forming the first portion and before forming the first conductive material layer. A surface of the inorganic material layer away from the substrate is conformal to a surface of the first portion away from the substrate.

In an exemplary embodiment of the present disclosure, forming the first electrode on the substrate and forming the conductive convex on the first electrode include: forming a second conductive material layer on the substrate; and patterning the second conductive material layer to form the first electrode and the conductive convex located on the first electrode.

In an exemplary embodiment of the present disclosure, the method further includes: forming an adhesive layer to cover the conductive convex and a portion of the first electrode located between the conductive convexes; placing an electronic device on the adhesive layer and applying a force to the electronic device so that the conductive convex penetrates the adhesive layer and contacts the electronic device; and curing the adhesive layer.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

Exemplary embodiments will now be described more fully with reference to the accompanying drawings.

At present, micro LED technology confronts quite a few technical challenges. The transfer and bonding of micro LED is one of the key technologies in micro LED technology.

In the related art, there are four methods for bonding micro LEDs. The first method is to use solder paste for bonding, but the solder paste needs to be heated during bonding, and heating will unnecessarily degrade the performance of the micro LED. The second method is to use anisotropic conductive adhesive for bonding, but the cost of anisotropic conductive adhesive is higher. The third method is to use die bonding welding for bonding, but applying pressure to the display substrate during bonding will adversely affect the characteristics of electronic elements such as thin film transistors in the display substrate. The fourth method is to use the way of metal directly contacting metal to transfer micro LED, but the adhesive between metal and metal is not easy to be discharged, which will reduce the contacting area between metal and metal.

Embodiments of the present disclosure provide a display substrate including conductive convexes. The conductive convex is configured to be easily connected to the micro LED, thereby reducing the manufacturing cost and improving the transferring efficiency for the micro LED.

Figure 1A:
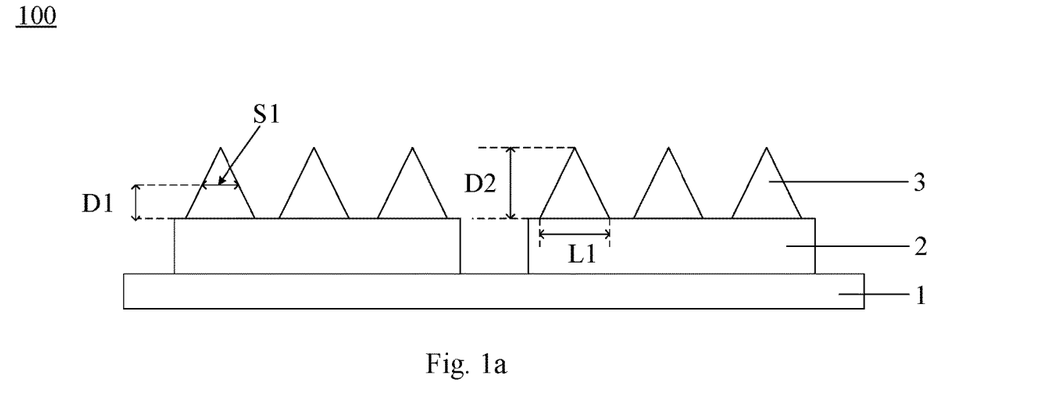
FIG. 1a shows a schematic view of a cross section of a display substrate according to an embodiment of the present disclosure.
Figure 1B:
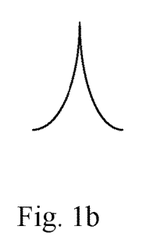
FIG. 1b to 1f show schematic views of shapes of conductive convexes according to an embodiment of the present disclosure.
Figure 1C:
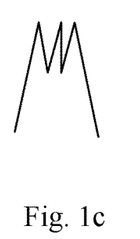
Figures 1D, 1E:
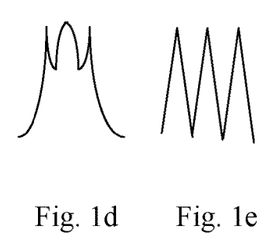
Figure 1F:
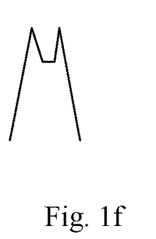

FIG. 1a shows a schematic view of a cross section of a display substrate according to an embodiment of the present disclosure. As shown in FIG. 1a, the display substrate 100 includes: a substrate 1; a first electrode 2 located on the substrate 1; and a conductive convex 3 located on the first electrode 2.

In an exemplary embodiment of the present disclosure, referring to FIG. 1a, a dimension of a cross section S1 of the conductive convex 3 along a plane parallel to the substrate 1 is negatively correlated to a distance D1 from the cross section S1 to a surface of the first electrode 2. Here, the negative correlation means that as the distance D1 is larger, the dimension of the cross section S1 is smaller. It should be noted that the dimension of the cross section S1 here may refer to, for example, the area of the cross section S1, and the surface of the first electrode 2 refers to the surface of the first electrode 2 that is in contact with the conductive convex 3. In addition, in an exemplary embodiment of the present disclosure, the number of conductive convexes may be one or more, which is not specifically limited in the present disclosure.

It should be noted that in FIG. 1a and other drawings to be described below, the proportional relationship between the dimensions of the components cannot be regarded as a limit to the present disclosure. It can be understood that, in order to clearly depict the structure of a certain component, the dimension of this component may be depicted as being larger than the dimension of other parts. The drawings of the present disclosure are merely exemplary and should not be considered as a limit to the present disclosure.

In an exemplary embodiment of the present disclosure, the ratio of the area of an orthographic projection of the conductive convexes 3 on the surface of the first electrode 2 to the surface area of the first electrode 2 may be greater than 20%, for example.

In an exemplary embodiment of the present disclosure, with continued reference to FIG. 1a, the ratio of the minimum dimension L1 of a surface of a side of the conductive convex 3 facing the substrate 1 along a direction parallel to the substrate 1 to a distance D2 from a top of the conductive convex 3 to the electrode 2 can range from 1:1 to 1:3.

In an exemplary embodiment of the present disclosure, a shape of the conductive convex 3 may be at least one selected from a group consisting of: a cone, a truncated cone, and a prism. As an example, in FIG. 1a, for example, the shape of the conductive convex may include a prism.

FIGS. 1b to 1f show schematic views of shapes of conductive convexes according to an embodiment of the present disclosure. The shapes of the conductive convex 3 in FIGS. 1b to 1f may be irregular shapes. For example, in FIG. 1b, the shape of the conductive convex 3 may be a cone with an arc-shaped side. For example, in FIGS. 1c to 1f, the conductive convex 3 may have a plurality of tips.

The structure of the conductive convex 3 of the embodiment of the present disclosure is specifically described below.

On the one hand, in an embodiment of the present disclosure, the conductive convex 3 includes a first portion and a second portion covering the first portion.

Figure 2:
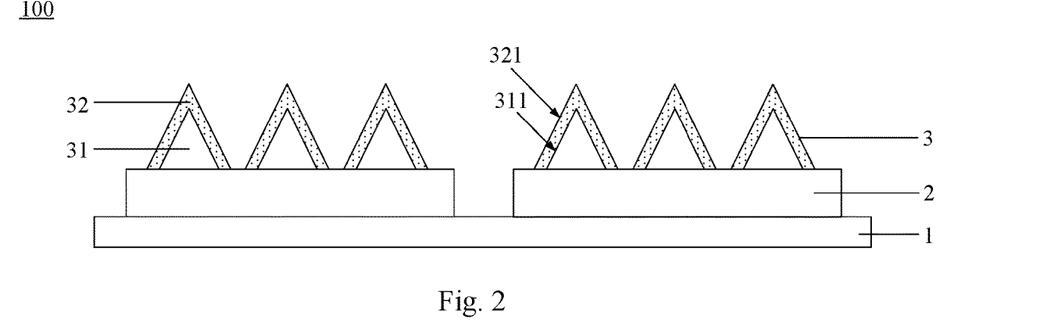
FIG. 2 shows a schematic view of a cross section of a display substrate according to another embodiment of the present disclosure.

Specifically, FIG. 2 shows a schematic view of a cross section of a display substrate according to an embodiment of the present disclosure. In an exemplary embodiment of the present disclosure, as shown in FIG. 2, the conductive convex 3 may include a first portion 31 and a second portion 32 covering the first portion 31. For example, an orthographic projection of the first portion 31 on the substrate 1 may be located within an orthographic projection of the first electrode 2 on the substrate 1. The second portion 32 may contact the first electrode 2. A surface 311 of the first portion 31 away from the substrate 1 may be conformal to a surface 321 of the second portion 32 away from the substrate 1. That is, the shape of a side of the first portion 31 away from the substrate 1 and the shape of a side of the second portion 32 away from the substrate 1 are similar shapes.

In an exemplary embodiment of the present disclosure, the first portion 31 of the conductive convex 3 may be composed of a dielectric material. In an exemplary embodiment of the present disclosure, the second portion 32 of the conductive convex 3 may be composed of a conductive material.

As an example, the dielectric material may include an organic material. Further, as an example, the organic material may include an organic resin material. For example, the organic resin material may include polyimide-type resin or acrylic-type resin.

As an example, the conductive material may include aluminum, copper, molybdenum, titanium, tungsten, or the like.

In an exemplary embodiment of the present disclosure, the material of the second portion 32 of the conductive convex 3 may be the same as or different from the material of the first electrode 2. Those skilled in the art can select according to needs or manufacturing processes, etc., and the present disclosure does not specifically limit this.

Figure 3:
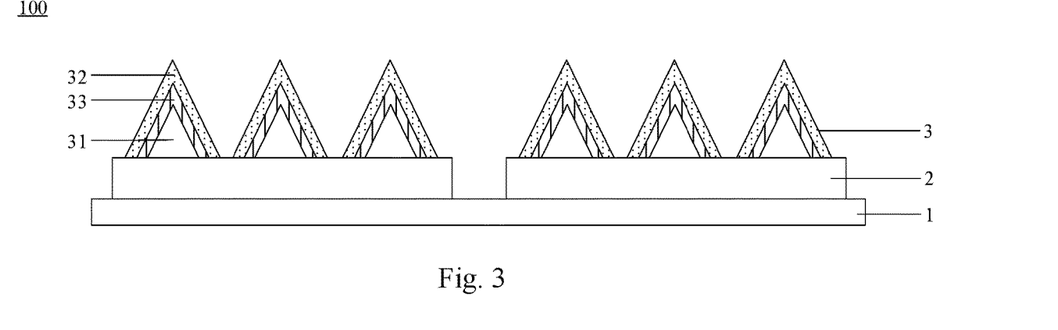
FIG. 3 shows a schematic view of a cross section of a display substrate according to yet another embodiment of the present disclosure.

FIG. 3 shows a schematic view of a cross section of a display substrate according to an embodiment of the present disclosure. Further, as an alternative embodiment of the present disclosure, as shown in FIG. 3, the conductive convex 3 may further include an inorganic material layer 33 covering the first portion 31 and located between the first portion 31 and the second portion 32. It should be noted that the inorganic material layer 33 may protect the underlying dielectric material (i.e., the first portion 31) during manufacturing the second portion 32 of the conductive convex 3. For example, when the second portion 32 is formed by sputtering, the sputtered ions (e.g., metal ions) continue to impact the surface of the first portion 31 and generate a large amount of heat, which causes the dielectric material such as an organic material of the second portion to have deformation such as collapse.

In an exemplary embodiment of the present disclosure, the material of the inorganic material layer 33 may include, for example, silicon nitride ($SiN_x$), silicon oxide ($SiO_x$), or the like.

Figure 4:
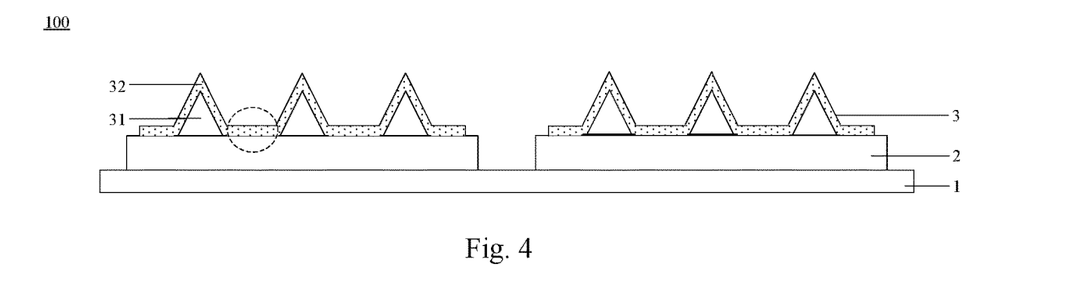
FIG. 4 shows a schematic view of a cross section of a display substrate according to yet another embodiment of the present disclosure.

FIG. 4 shows a schematic view of a cross section of a display substrate according to an embodiment of the present disclosure. Further, as an alternative embodiment of the present disclosure, the second portion 32 of the conductive convex 3 may also cover the surface of the first electrode 2 that is exposed and located between two adjacent first portions 31, as shown by the dotted circle in FIG. 4. This arrangement enables a more effective electrical connection between the conductive convex 3 and the first electrode 2, and thereby further reducing the contact resistance.

On the other hand, in an embodiment of the present disclosure, the conductive convex 3 may be composed of only a conductive material.

In an embodiment of the present disclosure, the first electrode 2 and the conductive convex 3 may be integrally formed. That is, the first electrode 2 and the conductive convex 3 are made of the same material and formed by the same step.

Figure 5:
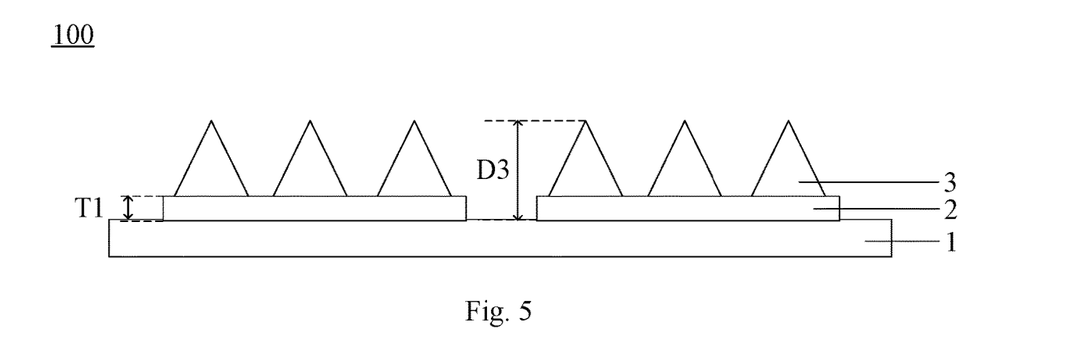
FIG. 5 shows a schematic view of a cross section of a display substrate according to yet another embodiment of the present disclosure.

FIG. 5 shows a schematic view of a cross section of a display substrate according to an embodiment of the present disclosure. As shown in FIG. 5, a ratio of the thickness T1 of the first electrode 2 to the distance D3 from the top of the conductive convex 3 to the bottom of the first electrode 2 may range from 1:4 to 1:2. As an example, the thickness T1 may be 0.5 µm. As an example, the range of the distance D3 may be 1-2 µm.

Similar to the above embodiment, in this embodiment, for example, the conductive material may include aluminum, copper, molybdenum, titanium, tungsten, or the like.

Figure 6:
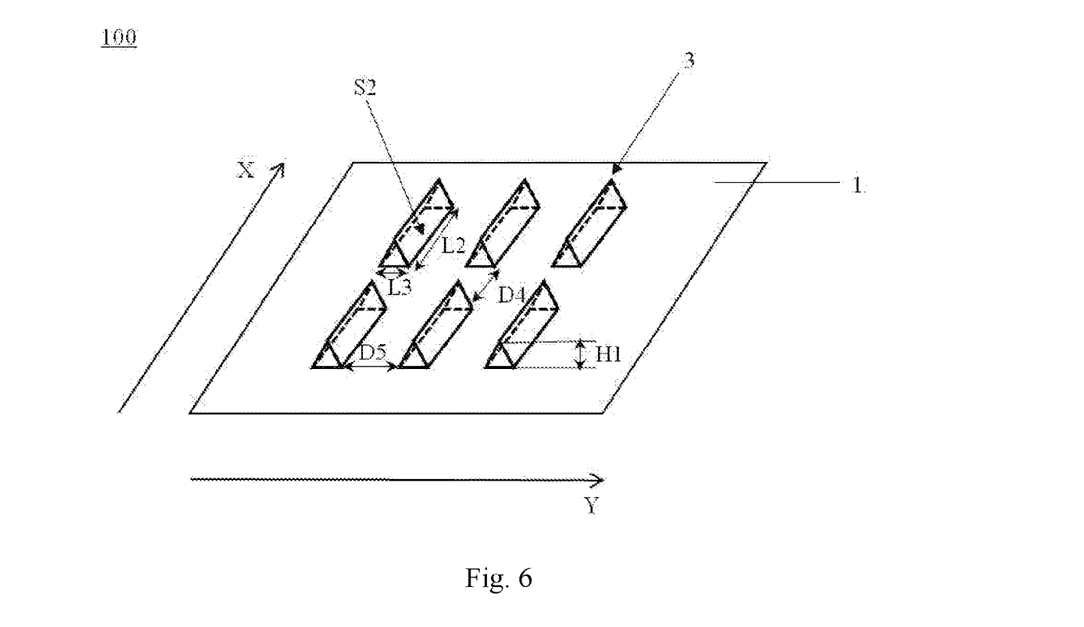
FIG. 6 shows a perspective view of a display substrate according to an embodiment of the present disclosure.

FIG. 6 shows a perspective view of the display substrate 100 according to an embodiment of the present disclosure. In an exemplary embodiment of the present disclosure, as shown in FIG. 6, a plurality of conductive convexes 3 arranged in an array are provided on each first electrode 2. It should be noted that the number of conductive convexes 3 shown in FIG. 6 is only exemplary and should not be considered as a limit to the present disclosure.

As shown in FIG. 6, as an alternative embodiment, the conductive convex 3 may include a triangular prism. In this embodiment, the triangular prism 3 may include a first surface S2 parallel to the surface of the substrate 1. The first surface S2 may include a first side L2 and a second side L3 intersecting the first side L2. As an example, the distance D4 between two adjacent conductive convexes 3 (i.e., the triangular prisms 3) along the extending direction of the first side L2 (i.e., the X direction) may range from 2 to 10 µm. As an example, the distance D5 between two adjacent conductive convexes 3 (i.e., triangular prisms 3) along the extending direction of the second side L3 (i.e., Y direction) may range from 2 to 5 µm. As an example, the dimension of the first side L2 may range from 2-10 µm, the dimension of the second side L3 may range from 1-5 µm, and the range of the height H1 of the triangular prism 3 along the direction perpendicular to the substrate 1 may be 1-5 µm.

As an alternative embodiment, the triangular prism 3 may include a regular triangular prism, as shown in FIG. 6.

Figure 7A:
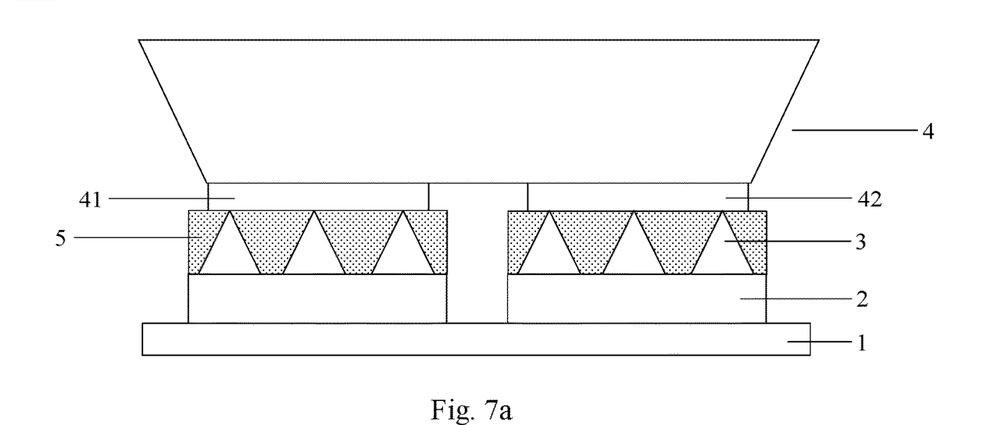
FIGS. 7a to 7c show schematic views of cross sections of a display substrate according to yet another embodiment of the present disclosure.

FIG. 7a shows a schematic view of a cross section of a display substrate according to an embodiment of the present disclosure. Further, as shown in FIG. 7a, the display substrate 100 may further include: an electronic device 4 located on the conductive convex 3; and an adhesive 5 located between the conductive convexes 3.

In an exemplary embodiment of the present disclosure, the pins 41, 42 of the electronic device 4 may be in contact with the conductive convex 3. The adhesive 5 joins the pins 41 and 42 to the first electrode 2. It should be noted that the distances D4, D5 between the conductive convexes 3 in FIG. 6 are configured to more effectively discharge the adhesive 5 from the joined position when the pins 41, 42 and the first electrode 2 are joined by the adhesive 5, thereby achieving good electrical contact between the pins 41, 42 and the first electrode 2.

Figure 7B:
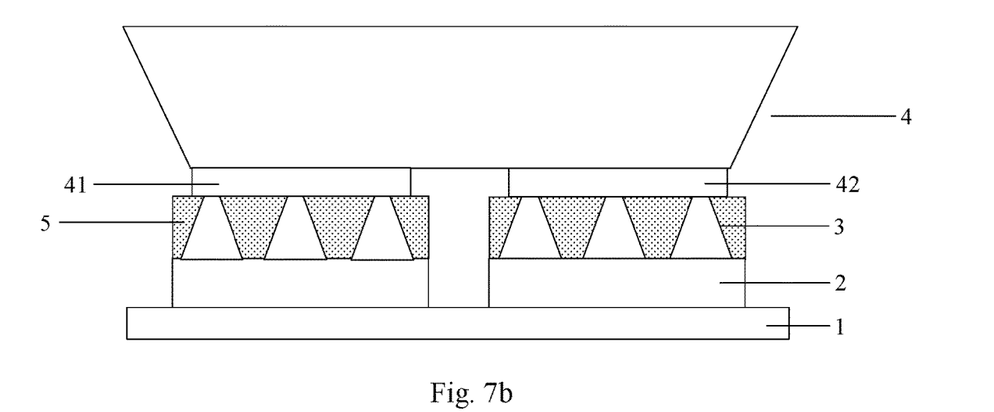
Figure 8:
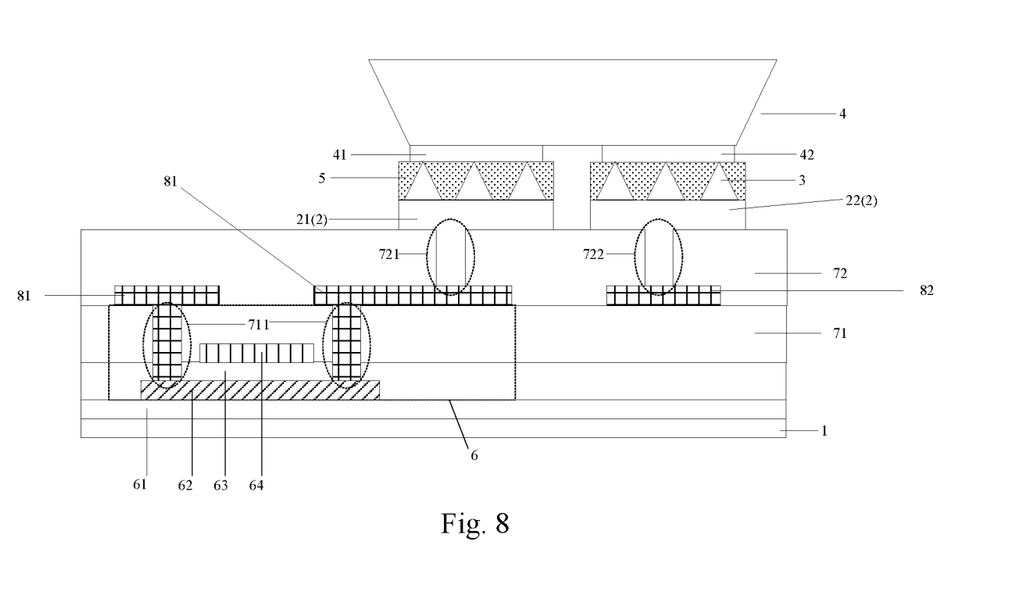
FIG. 8 shows a schematic view of a cross section of a display substrate according to yet another embodiment of the present disclosure.
Figure 22:
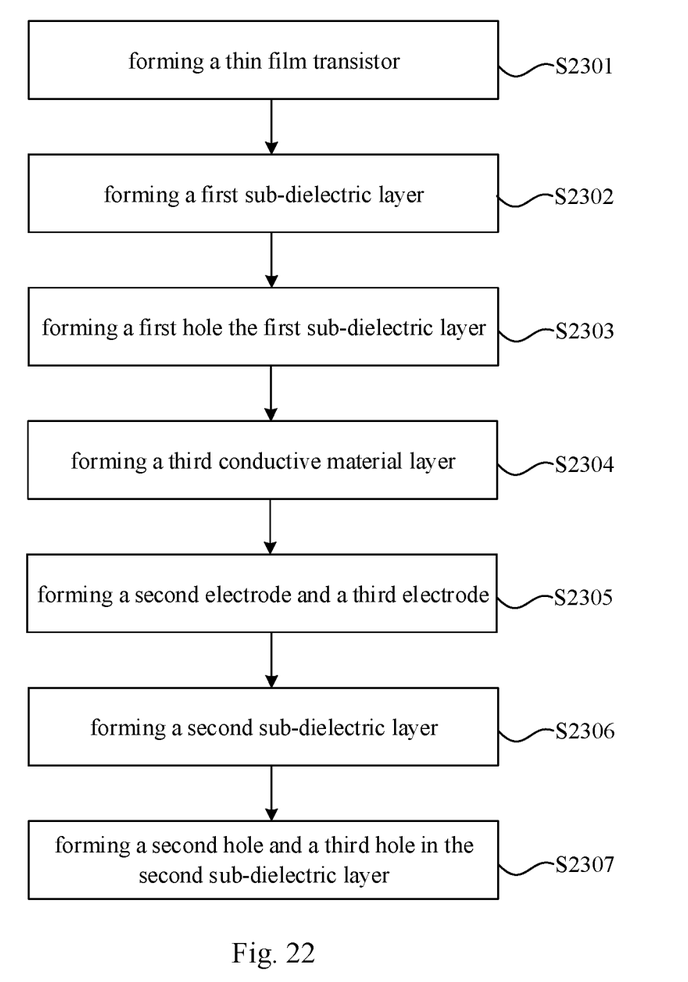

It should be noted that the contact state between the conductive convex 3 and the pins 41, 42 shown in FIG. 7a is only exemplary (the structures of FIGS. 8 and 22 are also exemplary hereinafter), which is not specifically limited herein. In practical applications, the top of the conductive convex 3 may be allowed to deform to fit the shape of the pins 41, 42, as shown in FIG. 7b.

Figure 7C:
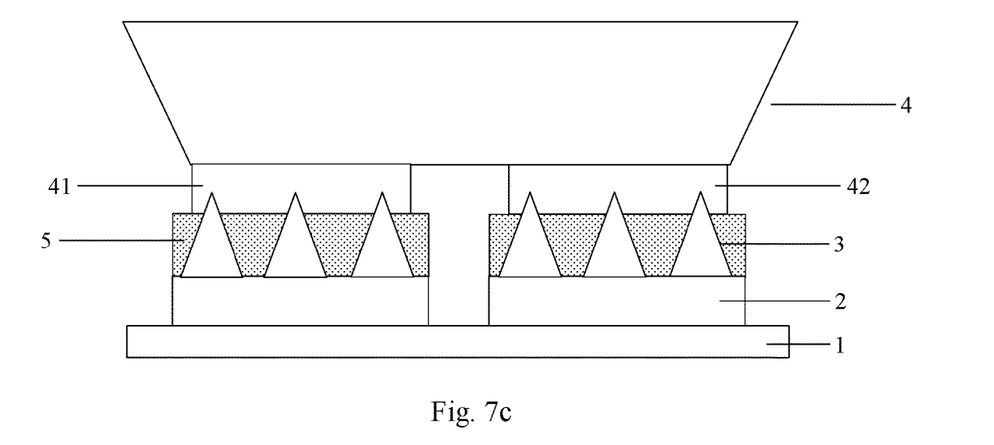

In addition, when the hardness of the material of the conductive convex 3 is greater than the hardness of the material of the pins 41, 42, the top of the conductive convex 3 can penetrate into the pins 41, 42 to achieve more effective electrical and mechanical connection, as shown in FIG. 7c.

In an exemplary embodiment of the present disclosure, the electronic device 4 may include a micro LED.

As an example, the material of the adhesive 5 may include silicone-based glue, resin-based glue, photocurable glue, or the like. As an example, the photocurable glue may include an acrylate-based prepolymer (also referred as oligomer), a reactive monomer, an ultraviolet photoinitiator, or the like. FIG. 8 shows a schematic view of a cross section of a display substrate according to an embodiment of the present disclosure. Further, as shown in FIG. 8, the display substrate 100 may further include: a thin film transistor 6 located on the substrate 1; and a first dielectric layer 7 located on the thin film transistor 6. In this embodiment, the first electrode 2 is located on the first dielectric layer 7 and is electrically connected to the thin film transistor 6. In an exemplary embodiment of the present disclosure, as shown in FIG. 8, the thin film transistor 7 may include: a buffer layer 61 located on the substrate 1; an active layer 62 located on the buffer layer 61; an insulating layer 63 covering the buffer layer 61 and the active layer 62; and a gate layer 64 located on the insulating layer 63. Although the thin film transistor 7 shown in FIG. 8 is a top-gate thin film transistor, the thin film transistor 7 may also be a bottom-gate thin film transistor. A person skilled in the art can select the type of thin film transistor according to needs. The thin film transistor 7 shown in FIG. 8 is merely exemplary and should not be considered as a limit to the present disclosure.

In an embodiment of the present disclosure, as shown in FIG. 8, the first dielectric layer 7 may include a first sub-dielectric layer 71 and a second sub-dielectric layer 72 sequentially stacked. The first sub-dielectric layer 71 may cover the insulating layer 63 and the gate layer 64. As an example, the first sub-dielectric layer 71 may be an interlayer insulating layer. As an example, the second sub-dielectric layer 72 may be a passivation layer or a planarization layer.

In addition, with continued reference to FIG. 8, the display substrate 100 may further include a second electrode 81 and a third electrode 82 located between the first sub-dielectric layer 71 and the second sub-dielectric layer 72. In an exemplary embodiment of the present disclosure, the second electrode 81 may be connected to the source/drain region of the thin film transistor 6 via a first hole 711 in the first sub-dielectric layer 71.

In an exemplary embodiment of the present disclosure, the second electrode 81 may be disposed in the same layer as the third electrode 82. That is, the second electrode 81 and the third electrode 82 may be composed of the same material and formed by the same step. As an example, the second electrode 81 may be the source/drain electrode of the thin film transistor 7. As an example, the third electrode 82 may be a wiring in the display substrate 100.

Further, In an exemplary embodiment of the present disclosure, with continued reference to FIG. 8, the first electrode 2 may include a first sub-electrode 21 and a second sub-electrode 22. The first sub-electrode 21 may be connected to the second electrode 81 via a second hole 721 in the second sub-dielectric layer 72. The second sub-electrode 22 may be connected to the third electrode 82 via a third hole 722 in the second sub-dielectric layer 72. As an example, the first electrode 2 may be a bonding pad used to bond the electronic device 4.

In an embodiment of the present disclosure, for example, after the electronic device 4 is bonded to the first electrode 2, the electronic device 4 can be controlled by the thin film transistor 7. As an example, when the electronic device 4 includes a micro LED, the thin film transistor 7 may control the light emission of the micro LED by the first electrode 2 and the conductive convex 3.

In an embodiment of the present disclosure, a method for manufacturing a display substrate is also provided. The display substrate manufactured according to the embodiments of the present disclosure includes conductive convexes. The conductive convex is configured to be easily connected to the micro LED, thereby being able to reduce the manufacturing cost and improve the bonding yield of the micro LED.

Figure 9:
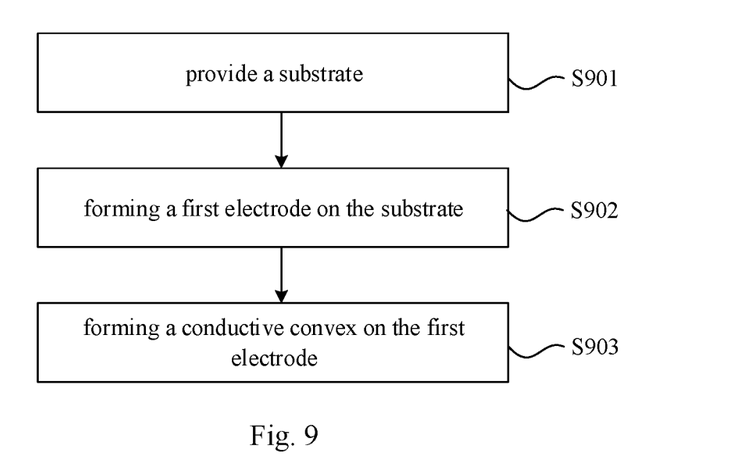
FIG. 9 shows a flowchart of a method for manufacturing a display substrate according to an embodiment of the present disclosure.

FIG. 9 shows a flowchart of a method for manufacturing a display substrate according to an embodiment of the present disclosure. As shown in FIG. 9, the method for manufacturing the display substrate may include steps S901 to S903. Referring to FIGS. 1a and 9, in step S901, a substrate 1 is provided. In step S902, the first electrode 2 is formed on the substrate 1. In step S903, a conductive convex 3 is formed on the first electrode 2.

Similar to the description about FIG. 1a, in an exemplary embodiment of the present disclosure, referring to FIG. 1a, the dimension of the cross section S1 of the conductive convex 3 along a plane parallel to the substrate 1 is negatively correlated to the distance D1 from the cross section S1 to the surface of the first electrode 2. Here, the negative correlation means that as the distance D1 is larger, the dimension of the cross section S1 is smaller. It should be noted that the dimension of the cross section S1 here may refer to, for example, the area of the cross section S1, and the surface of the first electrode 2 refers to the surface of the first electrode 2 that is in contact with the conductive convex 3. In addition, in an exemplary embodiment of the present disclosure, the number of conductive convexes may be one or more, which is not specifically limited in the present disclosure.

For some description about the conductive convex 3, reference may be made to the description about FIGS. 1a to 1f, which will not be repeated here.

The method for forming the conductive convex 3 is specifically described below.

On the one hand, the process for forming the conductive convex 3 according to an embodiment of the present disclosure is described with reference to FIGS. 10 to 17, and the structure of the formed conductive convex 3 is shown in FIG. 2.

Figure 10:
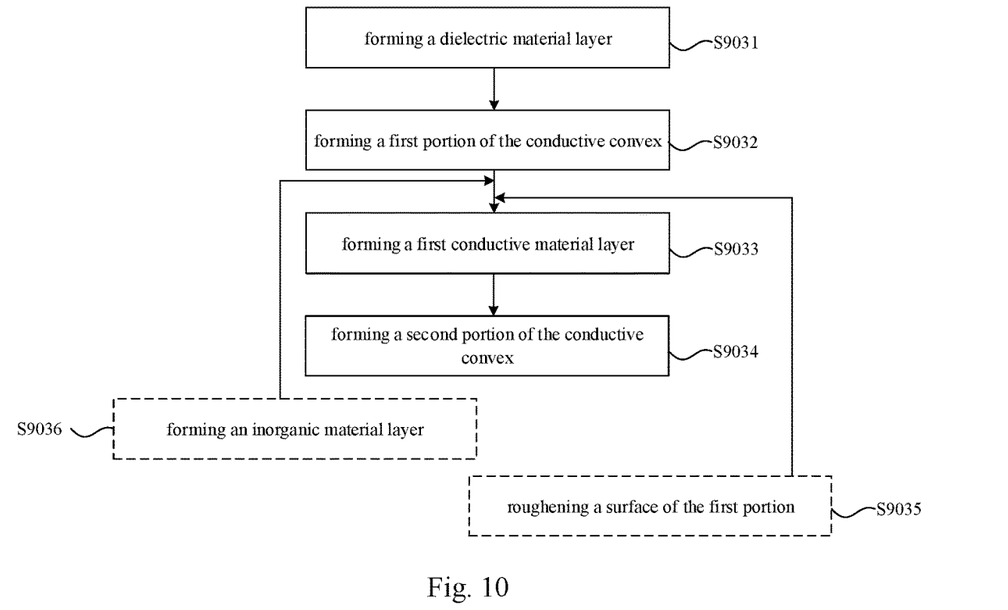
FIGS. 10 to 17 show schematic views of a method for forming a conductive convex according to an embodiment of the present disclosure.
Figure 11:
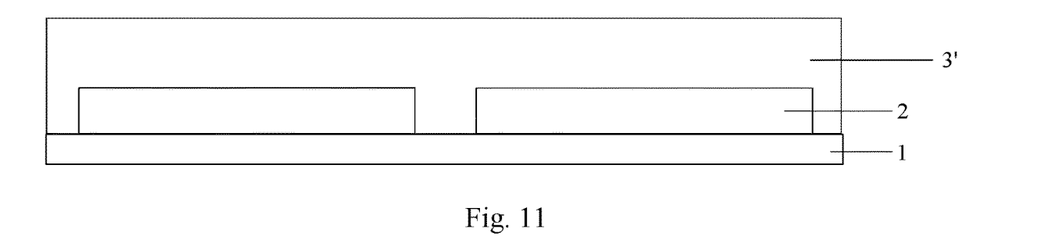

FIG. 10 shows a flowchart of a method for forming conductive convexes according to an embodiment of the present disclosure. Referring to FIGS. 10 and 11, in step S9031, a dielectric material layer 3' is formed on the substrate 1 and the first electrode 2.

With continued reference to FIG. 10, in step S9032, the dielectric material layer is patterned to form a first portion of the conductive convex.

In an exemplary embodiment of the present disclosure, the material of the dielectric material layer may include a photosensitive material. Further, as an example, the material of the dielectric material layer includes an organic photosensitive material.

For a material example of the dielectric material layer, reference may be made to the description about FIG. 2 above, and details are not repeated here.

Figure 12:
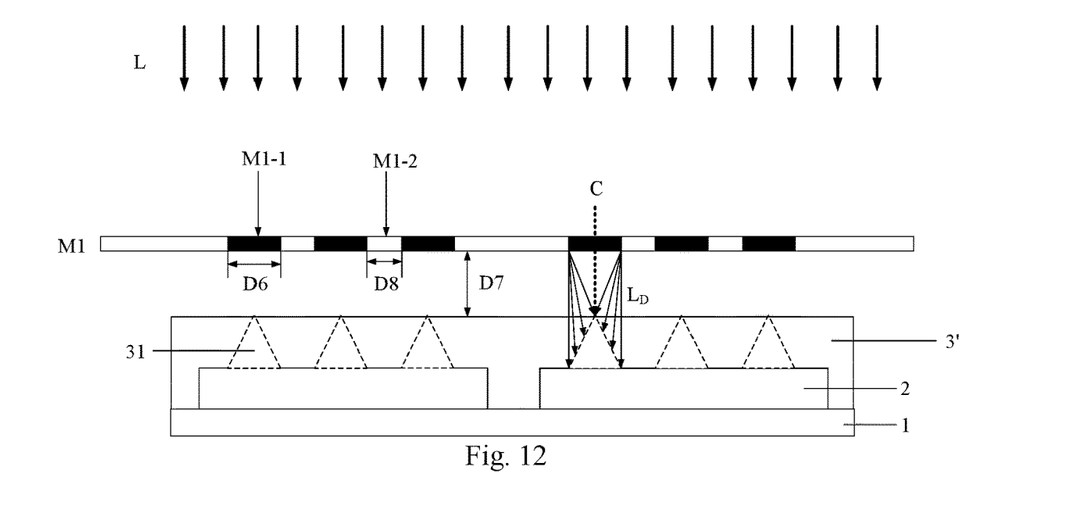

Specifically, in the case where the material of the dielectric material layer may include a photosensitive material, as shown in FIG. 12, patterning the dielectric material layer 3' may include exposing the dielectric material layer 3' using a first mask M1 and developing the dielectric material layer 3' to form a first portion 31 of the conductive convex 3 (as shown by the dotted line portion in FIG. 12).

In an exemplary embodiment of the present disclosure, a radiation dose of a light L for exposing the dielectric material layer 3', a dimension D6 of a light shielding portion M1-1 of the first mask M1 along a direction perpendicular to the direction in which the light shielding portion M1-1 extends, and a distance D7 from the first mask M1 to the dielectric material layer 3' are configured such that a diffracted light $L_D$ is generated at an edge of the light shielding portion M1-1 during exposure.

In an exemplary embodiment of the present disclosure, at least a portion of the diffracted light $L_D$ can reach the surface of the dielectric material layer 3' located below the central portion C of the light shielding portion M1-1. Since the intensity of the diffracted light $L_D$ incident on the corresponding portion of the dielectric material directly located below the central portion C decreases as the distance from the light shielding portion M1-1 to the corresponding portion decreases, thereby forming an unexposed portion having a convex shape of the corresponding portion of the dielectric material as indicated by the dotted line in FIG. 12. The unexposed portion will form the first portion 31 of the conductive convex 3.

In an exemplary embodiment of the present disclosure, with continued reference to FIG. 12, a ratio of the dimension D6 of the light shielding portion M1-1 of the first mask M1 to a dimension D8 of the non-light shielding portion M1-1 of the first mask M1 can range from 1:1 to 3:2.

In addition, in the conventional exposure process, the distance between the mask and the structure to be exposed is generally fixed. In an exemplary embodiment of the present disclosure, when the distance D7 from the first mask M1 to the dielectric material layer 3' is larger, the radiation dose of the light L may be increased. In contrast, when the distance D7 from the first mask M1 to the dielectric material layer 3' is smaller (even in contact state), the radiation dose of the light L can be reduced. A person skilled in the art can select according to an actual manufacturing process, which is not specifically limited herein.

As an alternative embodiment of the present disclosure, patterning the dielectric material layer 3' may include imprinting the dielectric material layer 3', thereby obtaining the first portion 31 of the conductive convex 3. In this embodiment, a surface of the imprint head for imprinting may have a concave structure corresponding to the convex.

Figure 13:
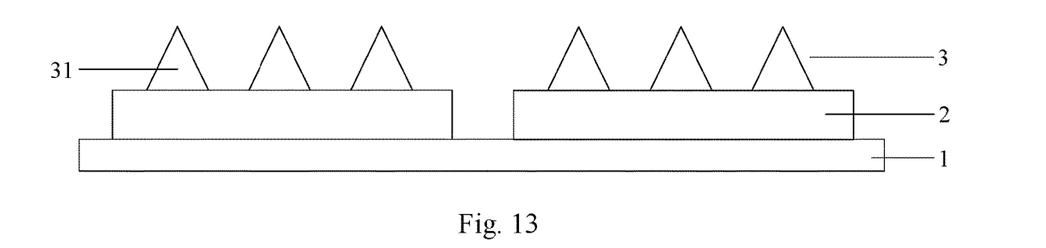

The structure finally obtained by the above method is shown in FIG. 13. Then, with continued reference to FIG. 10, in step S9033, a second portion of the conductive convex is formed.

Figure 14:
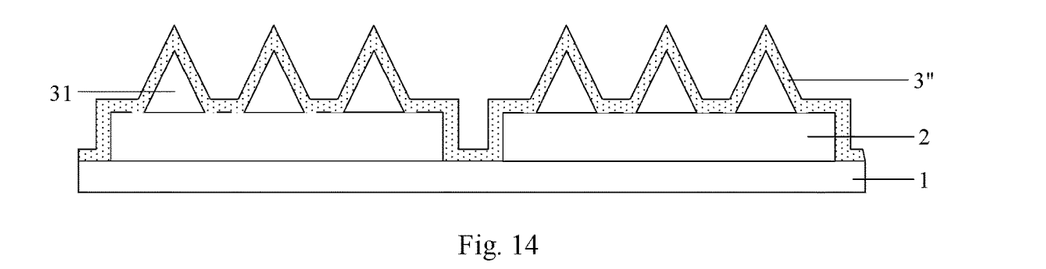

Specifically, in an exemplary embodiment of the present disclosure, referring to FIG. 14, a first conductive material layer 3" is formed on the surface of the substrate 1, the first electrode 2, and the first portion 31 of the conductive convex.

In an embodiment of the present disclosure, the method for forming the first conductive material layer 3" may include, for example, a sputtering method.

With continued reference to FIG. 10, in step S9034, a second portion of the conductive convex is formed.

Figure 15:
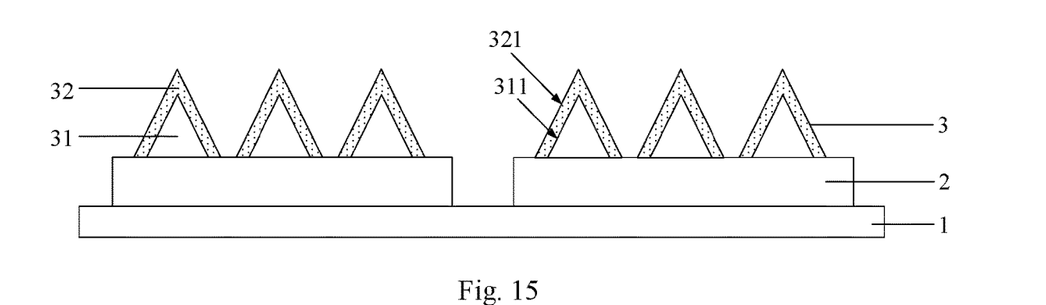
Figure 16:
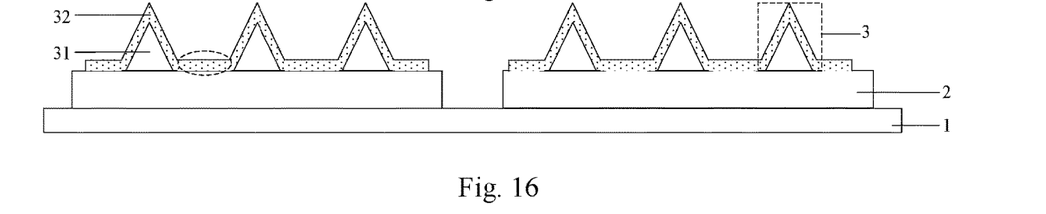

Specifically, in an embodiment of the present disclosure, referring to FIGS. 14 and 15, the first conductive material layer 3" is patterned to form the second portion 32 of the conductive convex 3. The resulting structure is shown in FIG. 15.

As an example, the patterning may use a photolithography method commonly used in the art, which is not specifically limited herein.

For a material example of the first conductive material layer, reference may be made to the description about FIG. 2 above, and details are not described herein again.

In an exemplary embodiment of the present disclosure, as shown in FIG. 15, the conductive convex 3 may include a first portion 31 and a second portion 32 covering the first portion 31. An orthographic projection of the first portion 31 on the substrate 1 may be located within an orthographic projection of the first electrode 2 on the substrate 1. The second portion 32 may contact the first electrode 2. A surface 311 of the first portion 31 away from the substrate 1 may be conformal to a surface 321 of the second portion 32 away from the substrate 1. As an alternative embodiment of the present disclosure, as shown in the dotted circle in FIG. 16, the second portion 32 of the conductive convex 3 may also be located on the surface of the first electrode 2 which is not covered by the first portion 31, thereby forming a more effective electrical connection between the conductive convex 3 and the first electrode 2.

As an alternative embodiment of the present disclosure, referring to FIG. 10, step S9035 may be included between step S9032 and step S9033. That is, before forming the first conductive material layer 3", referring to FIG. 13, the surface of the first portion 31 of the conductive convex 3 may be roughened. As an example, the roughening may include a micro etching process. Thereby, during the formation of the first conductive material layer 3", the adhesion of the first conductive material layer 3" on the first portion 31 of the conductive convex 3 can be increased.

As an alternative embodiment of the present disclosure, the formation of the first conductive material layer 3" by the sputtering method may cause the top of the first portion 31 of the conductive convex to collapse. To solve this problem, at least one of the following two methods can be used.

The first method is to reduce the deposition power of the first conductive material layer. That is, multiple times deposition method are used, but a small amount of conductive material is deposited each time, thereby improving the problem of collapse.

The second method is to form an inorganic material layer on the conductive convex after forming the first portion of the conductive convex and before forming the first conductive material layer. Referring to FIG. 10, a step S9036 for forming an inorganic material layer may be included between step S9032 and step S9033.

Figure 17:
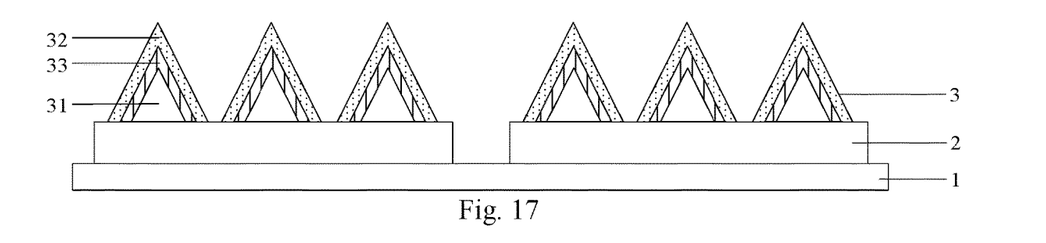

That is, in an exemplary embodiment of the present disclosure, as shown in FIG. 17, an inorganic material layer 33 may be formed on the surface of the first portion 31 after forming the first portion 31 and before forming the first conductive material layer 3". In addition, the inorganic material layer 33 may be formed on the surface of the first portion 31 after roughening the surface of the first portion 31 and before forming the first conductive material layer 3". Thereby, it is more favorable for the effective adhesion of the inorganic material layer 33 and the first conductive material layer 3" on the first portion 31.

In an exemplary embodiment of the present disclosure, a surface of the inorganic material layer 33 is conformal to the surface of the first portion 31 away from the substrate 1.

In an exemplary embodiment of the present disclosure, the material of the inorganic material layer 33 may include, for example, silicon nitride ($SiN_x$), silicon oxide ($SiO_x$), or the like.

Regarding the manufacturing method of the inorganic material layer 33, a process conventionally used in the art such as CVD can be used as long as the first portion 31 does not undergo undesirable deformation such as collapse.

On the other hand, the process for forming the conductive convex 3 according to an embodiment of the present disclosure is described with reference to FIGS. 18 to 22, and the structure of the formed conductive convex 3 is shown in FIG. 5.

Figure 18:
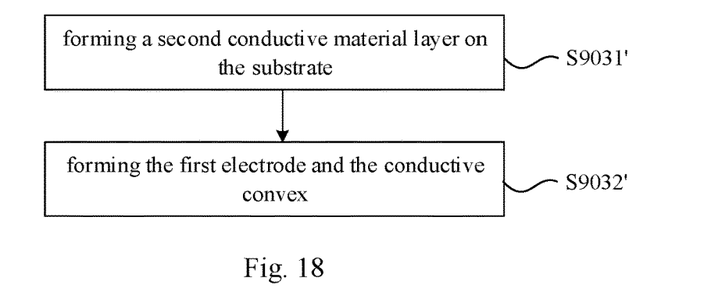
FIGS. 18 to 22 show schematic views of a method for forming a conductive convex according to another embodiment of the present disclosure.

FIG. 18 shows a flowchart of a method for forming a conductive convex according to an embodiment of the present disclosure. As shown in FIG. 18, the method for forming the conductive convex includes steps S9031' and S9032'.

Figure 19:
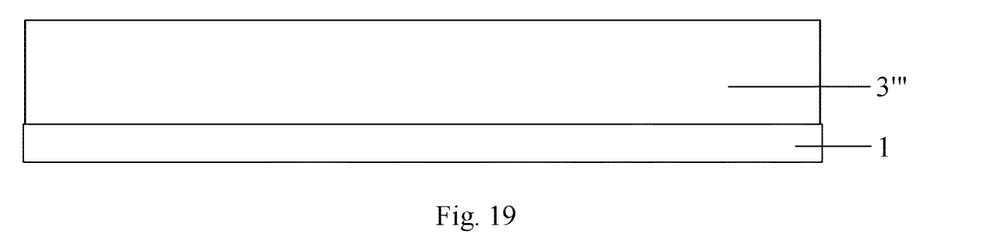

Referring to FIGS. 18 and 19, in step S9031', a second conductive material layer 3''' is formed on the substrate 1. As an example, the method for forming the second conductive material layer 3''' may include, for example, a sputtering method.

Referring to FIGS. 18 and 5, in step S9032', the second conductive material layer 3''' is patterned to form the first electrode 2 and the conductive convex 3 located on the first electrode 2.

As an example, the patterning may include a conventional photolithography method, which is not specifically limited herein.

In an exemplary embodiment of the present disclosure, the ratio of the thickness T1 of the first electrode 2 to the distance D3 from the top of the conductive convex 3 to the bottom of the first electrode 2 may range from 1:4 to 1:2. As an example, the thickness T1 may be 0.5 μm. As an example, the range of the distance D3 may be 1-2 μm.

Similar to the above embodiment, in this embodiment, for example, the conductive material may include aluminum, copper, molybdenum, titanium, tungsten, or the like.

It should be understood that, for other detailed descriptions of the conductive convexes, reference may be made to the descriptions in the foregoing embodiments of structures, and details are not described herein again.

Figure 20:
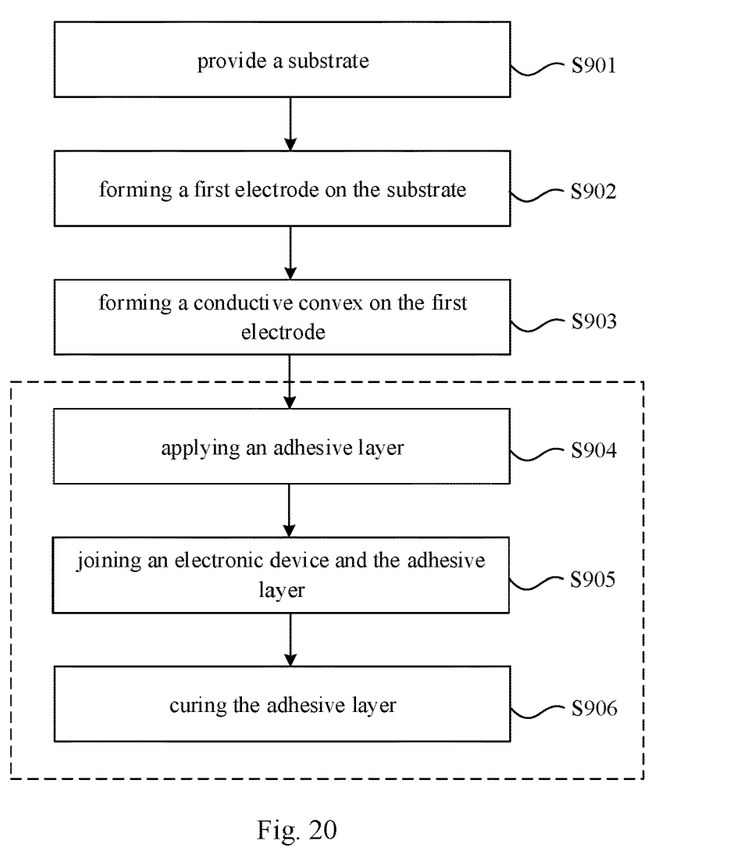

Further, in an exemplary embodiment of the present disclosure, the method for manufacturing a display substrate may further include steps S904 to S906, as shown by the steps within the dotted frame in the flowchart in FIG. 20.

Figure 21:
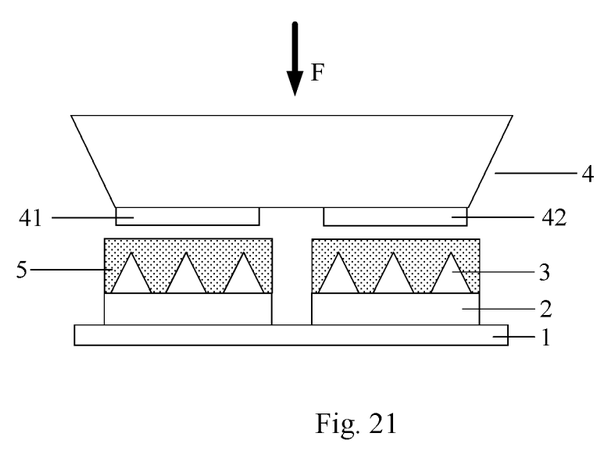

Referring to FIGS. 20 and 21, in step S904, an adhesive layer is applied. Specifically, an adhesive layer 5 is applied on and between the conductive convexes 3 so that the adhesive layer covers the top of the conductive convexes. In an exemplary embodiment of the present disclosure, a top surface of the adhesive layer 5 is higher than the top of the conductive convex 3 by about 1 µm. In step S905, referring to FIG. 21, an electronic device and the adhesive layer are joined to obtain the structure shown in FIG. 7a. Specifically, the electronic device 4 is placed over the adhesive layer 5 and a force F is applied to the electronic device 4 to cause the conductive convex 3 to penetrate the adhesive layer 5 and contact the electronic device 4, thereby the electronic device 4 is joined together with the first electrode 2 by the adhesive layer 5.

More specifically, in an exemplary embodiment of the present disclosure, when the pins 41, 42 of the electronic device 4 are joined to the first electrode 2 through the adhesive layer 5, a mass transfer technique is used to simultaneously transfer a plurality of electronic devices 4 to the adhesive layer 5 (for example, resin material). The pins 41 and 42 of the electronic device 4 are in contact with the conductive convexes 3. At this time, the pins 41, 42 of the electronic device 4 enter into the resin material.

It should be noted that the mass transfer technique refers to simultaneously transfer a large number of electronic devices to the structure described above with reference to FIGS. 1a and 2-5 (hereinafter, referred as an intermediate structure) by means of vacuum, static electricity, stickiness, etc. In the above process, the side of the intermediate structure having the conductive convexes 3 is facing upward to facilitate the joining with the electronic device 4. In an exemplary embodiment of the present disclosure, after the adhesive layer 5 (for example, a resin material) is applied to the intermediate structure, when the electronic device 4 is transferred and joined to the intermediate structure, the resin material may overflow around. Specifically, for example, when transferring the electronic device 4 to the intermediate structure, a certain pressure is needed for the electronic device 4 entering into the resin material, so that the pins 41 and 42 of the electronic device 4 are in contact with the top of the conductive convex. The entry of the electronic device 4 causes the resin material to overflow around.

It should be noted that the contact state between the conductive convexes 3 and the pins 41, 42 shown in FIG. 7a is only exemplary, and which is not specifically limited herein. In practical applications, the top of the conductive convex 3 may be allowed to deform to fit the shape of the pins 41, 42 as shown in FIG. 7b.

In addition, when the hardness of the material of the conductive convex 3 is greater than the hardness of the material of the pins 41, 42, the top of the conductive convex 3 can be penetrate into the pins 41, 42 to achieve more effective electrical and mechanical connection, as shown in FIG. 7c.

In step S906, the adhesive layer 5 is cured. As an example, the material of the adhesive layer 5 may include resin. The resin may contain a solvent, for example.

In an exemplary embodiment of the present disclosure, curing may be performed using a commonly used thermal curing process. For example, the resin material is heated to cure the resin material. It should be noted that since the resin material is doped with a solvent, when heating, these solvents evaporate, thereby curing the resin material. As an example, the temperature of heating may be about 140° C.

It should be understood that, when curing the resin material, the surface tension of the resin material will drive the electronic device 4 to be pressed down. In addition, due to the downward pressure exerted by the electronic device 4, the top of the conductive convex 3 pierces the resin material wrapped around the top thereof, thereby achieving electrical connection between the electronic device 4 and the first electrode 2. In addition, as an example, when the material hardness of the pins 41 and 42 of the electronic device 4 is less than that of the conductive convex 3, the top of the conductive convex 3 is finally penetrated into the pins 41 and 42 under the aforementioned tension, thereby the electrical connection between the electronic device 4 and the first electrode 2 is further guaranteed. Moreover, after the resin material is cured, the firmness of the electrical connection is also ensured.

In addition, as an alternative embodiment of the present disclosure, after the substrate is formed and before the first electrode is formed, the method for manufacturing the display substrate may further include steps S2301 to S2307, as shown in the flowchart in FIG. 22.

Referring to FIGS. 22 and 8, in step S2301, a thin film transistor is formed. Specifically, the thin film transistor 6 is formed on the first substrate 1.

More specifically, forming the thin film transistor 6 may include: forming a buffer layer 61 on the substrate 1; forming an active layer material layer on the buffer layer 61; patterning the active layer material layer to form the active layer 62; forming an insulating layer 63 on the buffer layer 61 and the active layer 62; forming a gate material layer on the insulating layer 63; and patterning the gate material layer to form the gate layer 64.

Next, in step S2302, a first sub-dielectric layer is formed. Specifically, the first sub-dielectric layer 71 is formed on the insulating layer 63 and the gate layer 64. As an example, the first sub-dielectric layer 71 may be an interlayer insulating layer.

In step S2303, a first hole is formed in the first sub-dielectric layer. Specifically, a first hole 711 exposing the source/drain region of the thin film transistor 6 (i.e., exposing the active layer 62) is formed in the first sub-dielectric layer 71 through processes such as exposure, development, and etching.

In step S2304, a third conductive material layer is formed. Specifically, a third conductive material layer is formed on the first sub-dielectric layer 71.

In step S2305, the second electrode and the third electrode are formed. Specifically, the third conductive material layer is patterned to form the second electrode 81 and the third electrode 82.

In an exemplary embodiment of the present disclosure, as an example, the second electrode 81 may be the source/drain electrode of the thin film transistor 7. The second electrode 81 may be connected to the active layer 62 of the thin film transistor 6 via the first hole 711. As an example, the third electrode 82 may be a wiring in the display substrate 100.

Then, in step S2306, a second sub-dielectric layer is formed. Specifically, the second sub-dielectric layer 72 is formed on the first sub-dielectric layer 71, the second electrode 81 and the third electrode 82. As an example, the second sub-dielectric layer 72 may be a passivation layer or a planarization layer.

In step S2307, a second hole and a third hole are formed in the second sub-dielectric layer. Specifically, the second sub-dielectric layer 72 is patterned to form the second and the third holes 721 and 722 in the second sub-dielectric layer 72. In this embodiment, the second hole 721 exposes the second electrode 81 and the third hole exposes the third electrode 82.

Furthermore, in an exemplary embodiment of the present disclosure, the first electrode 2 may include a first sub-electrode 21 and a second sub-electrode 22. The first sub-electrode 21 is connected to the second electrode 81 via the second hole 721 in the second sub-dielectric layer 72. The second sub-electrode 22 is connected to the third electrode 82 via the third hole 722 in the second sub-dielectric layer 72. As an example, the first electrode 2 may be a bonding pad used to bond the electronic device 4.

In an embodiment of the present disclosure, for example, after the electronic device 4 is bonded to the first electrode 2, the electronic device 4 can be controlled by the thin film transistor 7. As an example, when the electronic device 4 includes a micro LED, the thin film transistor 7 may control the light emission of the micro LED via the first electrode 2 and the conductive convex 3.

Regarding the specific process used for patterning, those skilled in the art may use conventional processes such as exposure, development, and etching, which will not be repeated here.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A display substrate, comprising:
   a substrate;
   a first electrode located on the substrate; and
   a conductive convex located on the first electrode,
   wherein a dimension of a cross section of the conductive convex along a plane parallel to the substrate is negatively correlated to a distance from the cross section to a surface of the first electrode, and
   wherein a ratio of a minimum dimension of a surface of a side of the conductive convex facing the substrate along a direction parallel to the substrate to a distance from the conductive convex to the first electrode ranges from 1:1 to 1:3, and
   wherein the conductive convex comprises a first portion, a second portion covering the first portion, and an inorganic material layer covering the first portion, the inorganic material layer being located between the first portion and the second portion, and
   wherein an orthographic projection of the first portion on the substrate is located within an orthographic projection of the first electrode on the substrate,
   the second portion is in contact with the first electrode,
   a surface of the second portion away from the substrate is conformal to a surface of the first portion away from the substrate, and
   the first portion is composed of a dielectric material, the dielectric material comprises an organic material, and the second portion is composed of a conductive material.

2. The display substrate according to claim 1, wherein a shape of the conductive convex is at least one selected from a group consisting of a cone, a truncated cone, and a prism.

3. The display substrate according to claim 1, wherein the second portion further covers a surface of the first electrode adjacent to the first portion.

4. The display substrate according to claim 1, wherein the conductive convex is composed of a conductive material.

5. The display substrate according to claim 4, wherein the first electrode is formed integrally with the conductive convex,
   wherein a ratio of a thickness of the first electrode to a distance from a top of the conductive convex to a bottom of the first electrode ranges from 1:4 to 1:2.

6. The display substrate according to claim 1, wherein a plurality of conductive convexes arranged in an array are disposed on each of the first electrodes.

7. The display substrate according to claim 6, wherein the conductive convex comprises a triangular prism,
   the triangular prism comprises a first surface parallel to the surface of the substrate, the first surface comprises a first side and a second side intersecting the first side,
   a dimension of the first side is 2-10 μm,
   a dimension of the second side is 1-5 μm,
   a height of the triangular prism along a direction perpendicular to the substrate is 1-5 μm,
   a distance between two adjacent conductive convexes in a direction of the first side is 2-10 μm, and
   a distance between two adjacent conductive convexes in a direction of the second side is 2-5 μm.

8. The display substrate according to claim 1, further comprising: an electronic device located on the conductive convex, wherein a pin of the electronic device is in contact with the conductive convex; and
   an adhesive located between the conductive convexes, the pin is joined to the first electrode by the adhesive.

9. The display substrate according to claim 8, further comprising:
   a thin film transistor located on the substrate; and
   a first dielectric layer located on the thin film transistor,
   wherein the first electrode is located on the first dielectric layer and is electrically connected to the thin film transistor.

10. A method for manufacturing a display substrate, comprising:
   provide a substrate;
   forming a first electrode on the substrate; and
   forming a conductive convex on the first electrode,
   wherein a dimension of a cross section of the conductive convex along a plane parallel to the substrate is negatively correlated to a distance from the cross section to a surface of the first electrode, and
   wherein a ratio of a minimum dimension of a surface of a side of the conductive convex facing the substrate along a direction parallel to the substrate to a distance from the conductive convex to the first electrode ranges from 1:1 to 1:3,
   wherein forming the conductive convex comprises:
      forming a dielectric material layer on the first electrode;
      patterning the dielectric material layer to form a first portion of the conductive convex;
      forming a first conductive material layer on the substrate, the first electrode, and the first portion; and patterning the first conductive material layer to form a second portion of the conductive convex, wherein an orthographic projection of the first portion on the first electrode is located within an orthographic projection of the second portion on the first electrode, the second portion covers the first electrode and is in contact with the first electrode, and a surface of the second portion away from the substrate is conformal to a surface of the first portion away from the substrate, wherein forming the conductive convex further comprises: forming an inorganic material layer on the first portion after forming the first portion and before forming the first conductive material layer, wherein a surface of the inorganic material layer away from the substrate is conformal to a surface of the first portion away from the substrate are conformal.

11. The method according to claim 10, wherein before forming the first conductive material layer on the first portion, further comprising roughening a surface of the first portion.

12. The method according to claim 10, wherein the dielectric material layer comprises a photosensitive material, patterning the dielectric material layer comprises exposing the dielectric material layer using a first mask and developing the dielectric material layer, wherein a radiation dose of a light used for the exposure, a dimension of a light shielding portion of the first mask along a direction perpendicular to a direction in which the light shielding portion extends, and a distance between the first mask and the dielectric material layer are configured such that a diffracted light is generated at an edge of the light shielding portion during the exposure, wherein at least a portion of the diffracted light can reach a surface of the dielectric material layer located below a central portion of the light shielding portion.

13. The method according to claim 10, wherein forming the first electrode on the substrate and forming the conductive convex on the first electrode comprise:

forming a second conductive material layer on the substrate; and patterning the second conductive material layer to form the first electrode and the conductive convex located on the first electrode.

14. The method according to claim 10, further comprising:

forming an adhesive layer to cover the conductive convex and a portion of the first electrode located between the conductive convexes;

placing an electronic device on the adhesive layer and applying a force to the electronic device so that the conductive convex penetrates the adhesive layer and contacts the electronic device; and curing the adhesive layer.

* * * * *